United States Patent
Cho et al.

(10) Patent No.: US 9,024,381 B2
(45) Date of Patent: May 5, 2015

(54) SEMICONDUCTOR DEVICE AND FABRICATING METHOD THEREOF

(75) Inventors: Moon-soo Cho, Seoul (KR); Kwang-yeon Jun, Bucheon-si (KR); Hyuk Woo, Incheon (KR); Chang-sik Lim, Bucheon-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 55 days.

(21) Appl. No.: 13/433,630

(22) Filed: Mar. 29, 2012

(65) Prior Publication Data

US 2013/0161742 A1    Jun. 27, 2013

(30) Foreign Application Priority Data

Dec. 23, 2011   (KR) .......................... 10-2011-0141806

(51) Int. Cl.
| | |
|---|---|
| H01L 29/66 | (2006.01) |
| H01L 21/336 | (2006.01) |
| H01L 29/06 | (2006.01) |
| H01L 29/78 | (2006.01) |
| H01L 29/10 | (2006.01) |

(52) U.S. Cl.
CPC ........ *H01L 29/0634* (2013.01); *H01L 29/0615* (2013.01); *H01L 29/66712* (2013.01); *H01L 29/7802* (2013.01); *H01L 29/1095* (2013.01)

(58) Field of Classification Search
CPC ............ H01L 29/0634; H01L 29/7802; H01L 29/1095; H01L 29/0615; H01L 29/66712
USPC .................. 257/328, 329, 335, 339, 341, 342, 257/E21.409, E21.418, E29.257; 438/197, 438/257, 268
See application file for complete search history.

(56) References Cited

U.S. PATENT DOCUMENTS

| | | | |
|---|---|---|---|
| 6,300,171 B1 * | 10/2001 | Frisina ........................ | 438/140 |
| 2008/0150073 A1 * | 6/2008 | Willmeroth et al. .......... | 257/492 |
| 2009/0273031 A1 * | 11/2009 | Saito et al. .................... | 257/339 |

* cited by examiner

*Primary Examiner* — Fernando L Toledo
*Assistant Examiner* — Aaron Gray
(74) *Attorney, Agent, or Firm* — NSIP Law

(57) ABSTRACT

A semiconductor device and a fabricating method thereof are provided. The semiconductor device includes a substrate, and a super junction area that is disposed above the substrate. The super junction area may include pillars of different doping types that are alternately disposed. One of the pillars of the super junction area may have a doping concentration that gradually decreases and then increases from bottom to top in a vertical direction of the semiconductor device.

24 Claims, 26 Drawing Sheets

SEMICONDUCTOR DEVICE AND FABRICATING METHOD THEREOF

CROSS-REFERENCE TO RELATED APPLICATION

This application claims the benefit of priority under 35 U.S.C. §119(a) of Korean Patent Application No. 10-2011-0141806, filed on Dec. 23, 2011, in the Korean Intellectual Property Office, the entire disclosure of which is incorporated herein by reference for all purposes.

BACKGROUND

1. Field

The following description relates to a semiconductor device and a fabricating method thereof, and, for example, to a semiconductor device having a super junction structure and a fabricating method of such a semiconductor device.

2. Description of Related Art

High voltage power devices are often used in power integrated circuit (IC) apparatuses for power conversion and in power control systems. A planar gate metal oxide semiconductor field effect transistor (MOSFET) is often used as a high voltage device. Such a planar gate semiconductor device is illustrated in FIGS. 5 and 6.

FIG. 5 illustrates an example of a conventional planar gate MOSFET, and FIG. 6 illustrates the distribution of electric field that may be formed between area A and area B in the planar gate MOSFET depicted in FIG. 5.

A cross-sectional structure of a unit cell of the conventional planar gate MOSFET is illustrated in FIG. 5. The on-resistance of the unit cell may be affected by components of the channel, the junction field effect transistor (JFET), an epilayer (drift region), the substrate and the like. The amount of internal pressure and the distribution of electric field in the conventional planar gate MOSFET are graphically illustrated in FIG. 6. As illustrated in the graph of FIG. 6, the distribution of electric field in a conventional planar gate MOSFET is determined by its depletion layer that is formed between a p body well and an n-epilayer due to a voltage that is applied to the drain when the gate voltage is equal to the source voltage.

Therefore, in the conventional planar gate MOSFET, the thickness and the dopant concentration of the epilayer are usually set to be larger than or equal to a predetermined value in order to obtain a favorable distribution of the electric field. As a result, it is difficult to set the resistance of the epilayer to be lower than or equal to a predetermined value. Due to the relationship between the resistance and the distribution of electric field, limits may be imposed on lowering the resistance of the epilayer.

In order to solve this problem, the use of a super junction structure has been proposed. An example of a semiconductor device having a super junction structure is illustrated in FIGS. 7 and 8.

FIG. 7 depicts a cross-sectional view illustrating an example of a structure of a semiconductor device having a super junction structure. FIG. 8 depicts a graph illustrating the distribution of electric field that is formed between areas A, B and C in the semiconductor device illustrated in FIG. 7.

As illustrated in FIG. 7, the super junction structure is similar to the gate and p body well structure of a typical MOSFET. However, in a super junction semiconductor device, additional structures may be present in the drift region under the p body well in order to obtain the super junction characteristic.

In a typical MOSFET, a depletion layer extends in a vertical direction when a voltage is applied to the drain. However, in a semiconductor device with a super junction, a depletion layer extends in both vertical and horizontal directions as illustrated in FIG. 8. In such a device, when charge quantities of two areas are equal to each other, both of n-type and p-type areas are completely depleted. Therefore, no net charge exists in the vertical direction; thus, the electric field is theoretically uniform in the vertical direction.

Therefore, if charges are completely balanced between pillars in the semiconductor device having a super junction structure, an electric field distribution obtained from the semiconductor device is proportional to depths of the pillars; this electric field distribution is different from that of a typical MOSFET. Also, the dopant concentration of an n-type pillar that is in a drift region may be increased to obtain a lower resistance.

Attempts have been made to obtain both a low on-resistance and a favorable electric field distribution by using a super junction structure as described above. However, in such a semiconductor device, if the dopant quantity in the p-type pillar is different from the dopant quantity in the n-type pillar, a breakdown voltage can be substantially lowered as illustrated in the graph of FIG. 9.

Accordingly, a method that does not substantially lower the breakdown voltage even when the dopant quantities in the n-type and p-type pillars are different from each other is desirable in obtaining a semiconductor device having a super junction structure.

SUMMARY

In one general aspect, there is provided a semiconductor device having a super junction structure. The semiconductor device includes a substrate, and a super junction area that is disposed above the substrate, the super junction area including pillars of different doping types that are alternately disposed, one of the pillars of the super junction area having a doping concentration that gradually decreases and then increases from bottom to top in a vertical direction of the semiconductor device.

The general aspect of the semiconductor device may further provide that the super junction area includes first, second, and third areas that are sequentially disposed from bottom to top in the vertical direction, and the dopant of a first doping type is predominant in the first and third areas, and the dopant of a second doping type is predominant in the second area.

The general aspect of the semiconductor device may further provide that the dopant of the first doping type is a p-type dopant, and the dopant of the second doping type is an n-type dopant.

The general aspect of the semiconductor device may further provide that the super junction area of another example includes a first pillar of a first doping type, a second pillar of a second doping type, and a third pillar of the first doping type which are sequentially disposed in a horizontal direction of the semiconductor device.

The general aspect of the semiconductor device may further provide that the first and third pillars of the semiconductor device have doping concentrations that gradually decrease and then increase from the bottom to the top in the vertical direction.

The general aspect of the semiconductor device may further provide that the charge quantities of lower areas of the first and third pillars are larger than a charge quantity of a lower area of the second pillar, the charge quantities of middle areas of the first and third pillars are smaller than a charge quantity of a middle area of the second pillar, and the charge quantities of upper areas of the first and third pillars are larger than a charge quantity of an upper area of the second pillar.

The general aspect of the semiconductor device may further provide that the dopant of the first doping type of the semiconductor device is a p-type dopant, and the dopant of the second doping type is an n-type dopant.

The general aspect of the semiconductor device may further include a plurality of body well areas of a first doping type that are respectively disposed on the first and third pillars, a plurality of doping areas of a second doping type that are disposed in the plurality of body well areas, an insulating layer that is disposed over the plurality of doping area and on the super junction area, gate electrodes formed on the insulating layer, and source electrodes formed on the plurality of body well areas.

The general aspect of the semiconductor device may further provide that the substrate of the semiconductor device is an n-type substrate.

In another general aspect, there is provided a method of fabricating a semiconductor device. The method includes forming a super junction area above a substrate, in which pillars of different doping types are alternately disposed in the super junction area, forming a plurality of body well areas of a first doping type respectively on a plurality of pillars of the super junction area having the same doping type, forming a plurality of doping areas of a second doping type in the plurality of body well areas, forming an insulating layer that is disposed over the plurality of doping areas and on the super junction area, forming gate electrodes on the insulating layer, and forming source electrodes on the plurality of body well areas. One of the pillars of the super junction area has a doping concentration that gradually decreases and then increases from bottom to top in a vertical direction.

The general aspect of the method of fabricating a semiconductor device may further provide that the super junction area is formed to include a first area in which dopant of a first doping type is predominant, a second area in which dopant of a second doping type is predominant, and a third area in which dopant of a first doping type is predominant, the first, second, and third areas being sequentially disposed from the bottom in the vertical direction.

The general aspect of the method of fabricating a semiconductor device may further provide that the dopant of the first doping type is a p-type dopant, and the dopant of the second doping type is an n-type dopant.

The general aspect of the method of fabricating a semiconductor device may further provide that the super junction area is formed to include a first pillar of a first doping type, a second pillar of a second doping type, and a third pillar of the first doping type which are sequentially disposed in a horizontal direction.

The general aspect of the method of fabricating a semiconductor device may further provide that the first and third pillars have doping concentrations that gradually decrease and then increase from the bottom to the top in the vertical direction.

The general aspect of the method of fabricating a semiconductor device may further provide that the charge quantities of lower areas of the first and third pillars are larger than a charge quantity of a lower area of the second pillar, the charge quantities of middle areas of the first and third pillars are smaller than a charge quantity of a middle area of the second pillar, and the charge quantities of upper areas of the first and third pillars are larger than a charge quantity of an upper area of the second pillar.

The general aspect of the method of fabricating a semiconductor device may further provide that the dopant of the first doping type is a p-type dopant, and the dopant of the second doping type is a n-type dopant.

The general aspect of the method of fabricating a semiconductor device may further provide that the forming of the super junction area include depositing an epilayer of a second doping type on the substrate, forming a plurality of trenches in the epilayer, depositing a first intrinsic silicon layer in the plurality of trenches so that the first intrinsic silicon layer is inclined, performing an ion-injection process with dopant of a first doping type on the first intrinsic silicon layer, depositing a second intrinsic silicon layer on the first intrinsic silicon layer, and performing an ion-injection process with dopant of a first doping type on the second intrinsic silicon layer.

The general aspect of the method of fabricating a semiconductor device may further provide that the forming of the super junction area further involve depositing a third intrinsic silicon layer on the second intrinsic layer to fill a gap between the plurality of trenches, and polishing an upper part of the substrate.

The general aspect of the method of fabricating a semiconductor device may further provide that the first intrinsic silicon layer has a width that narrows from the bottom to the top in the vertical direction. The first intrinsic silicon layer may have a V shape.

The general aspect of the method of fabricating a semiconductor device may further provide that the forming of the super junction area further involve performing an ion-injection process with dopant of a second doping type before depositing the first intrinsic silicon layer.

The general aspect of the method of fabricating a semiconductor device may further provide that the forming of the super junction area involve forming a lower epilayer on the substrate, the lower epilayer having a doping concentration that gradually decreases from the bottom to the top in the vertical direction, and forming an upper epilayer on the lower epilayer, the upper epilayer having a doping concentration that gradually increases from the bottom to the top in the vertical direction.

The general aspect of the method of fabricating a semiconductor device may further provide that the process of depositing an epilayer and an ion-injection process may be repeatedly performed to form the lower epilayer having the doping concentration that gradually decreases from the bottom to the top in the vertical direction.

The general aspect of the method of fabricating a semiconductor device may further provide that the process of depositing an epilayer and an ion-injection process may be repeatedly performed to form the upper epilayer on the lower epilayer, the upper epilayer having a doping concentration that gradually decreases from the bottom to the top in the vertical direction.

The general aspect of the method of fabricating a semiconductor device may further provide that the forming of the super junction area further involves depositing a first epilayer of a second doping type on the substrate, performing a first ion-injection process of a first doping type dopant with respect to a first position on the first epilayer, depositing a second epilayer of a second doping type on the first epilayer, performing a second ion-injection process with dopant of a first doping type with respect to a second position on the second epilayer in a smaller dopant quantity than in the first ion-injection process, depositing a third epilayer of a second doping type on the second epilayer, performing a third ion-injection process with dopant of a first doping type with respect to a third position on the third epilayer in a smaller dopant quantity than in the second ion-injection process, depositing a fourth epilayer of a second doping type on the third epilayer, performing a fourth ion-injection process with dopant of a first doping type with respect to a fourth position on the fourth epilayer in a smaller dopant quantity than in the third ion-injection process, depositing a fifth epilayer of a second doping type on the fourth epilayer, and performing a fifth ion-injection process with dopant of a first doping type with respect to a fifth position on the fifth epilayer in a larger dopant quantity than the fourth ion-injection process, the first, second, third, fourth, and fifth positions being the same positions in a horizontal direction of the semiconductor device.

Other features and aspects may be apparent from the following detailed description, the drawings, and the claims.

DETAILED DESCRIPTION

The following detailed description is provided to assist the reader in gaining a comprehensive understanding of the methods, apparatuses, and/or structures described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is understood that the features of the present disclosure may be embodied in different forms and should not be construed as limited to the examples set forth herein. Rather, examples are provided so that this disclosure will be thorough and complete, and will convey the full scope of the present disclosure to those skilled in the art.

The drawings may not be necessarily to scale, and, in some instances, proportions may have been exaggerated in order to clearly illustrate features of the examples. Further, when a first layer is referred to as being "on" a second layer or "on" a substrate, it may not only refer to a case where the first layer is formed directly on the second layer or the substrate but may also refer to a case where a third layer exists between the first layer and the second layer or the substrate.

Figure 1:
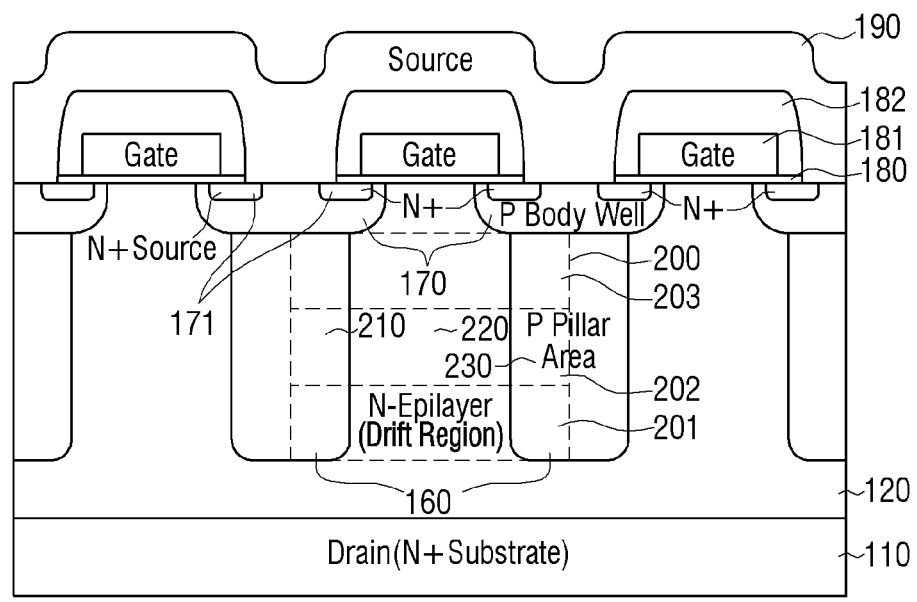
FIG. 1 is a cross-sectional view illustrating an example of a structure of a semiconductor device according to a general aspect.

FIG. 1 illustrates an example of a structure of a semiconductor device 100 according to a general aspect.

As depicted in FIG. 1, the semiconductor device 100 includes a substrate 110, a super junction area 200, body well areas 170, doping areas 171, an gate insulating layer 180, gate electrodes 181, an insulating layer 182, and source electrodes 190. The semiconductor device 100 of this example is a super junction metal oxide semiconductor field effect transistor (MOSFET) device.

The substrate 110 of the semiconductor device 100 may be a plain silicon substrate without doping or an n-type substrate doped with n-type dopant. For example, the substrate 110 may be a plain silicon substrate into which an n-type dopant, such as phosphorous (P) or arsenic (As), is ion-injected.

The super junction area 200 is disposed above the substrate 110 and may include pillars of different doping types that are alternately disposed. For example, in the super junction area 200, a first pillar 210 of a first doping type, a second pillar 220 of a second doping type, and a third pillar 230 of the first doping type are sequentially disposed in a horizontal direction of the semiconductor device 100. The first doping type is a p-type, and the second doping type is an n-type.

The first pillar 210 is a pillar of a first doping type that has a doping concentration that gradually decreases and then increases from the bottom to the top of the pillar in a vertical direction of the semiconductor device 100 from the substrate 110 side. For example, the first pillar 210 may be a p-type pillar. In order to form the p-type pillar, as illustrated in FIGS. 2A through 2K, an n-type dopant may be ion-injected (i.e., counter-doped) into trenches 130 that are formed in the epilayer 120. A first intrinsic silicon layer 140 may be deposited into the trenches 130. The deposited first intrinsic silicon layer 140 may be then silicon-etched to form a first intrinsic silicon layer 140 having inclined surfaces as illustrated in FIG. 2E. A p-type doping material, such as boron (B) or indium (In), may be first ion-injected into the first intrinsic silicon layer 140, and then a second intrinsic silicon layer 145 may be deposited on the first intrinsic silicon layer 140. A p-type doping material, such as B or In, may be then ion-injected into the second intrinsic silicon layer 145. As illustrated in FIGS. 3A through 3H, the first pillar 210 may be a p-type pillar that is formed by changing the concentration of p-type dopant, such as B or In, during the process of depositing a plurality of epilayers in stages.

The second pillar 220 is a pillar of a second doping type. For example, as illustrated in FIGS. 2A through 3H, the second pillar 220 is an n-type epilayer region that remains after the formation of the first and third pillars 210 and 230 in the epilayer 120.

The third pillar 230 is a pillar of the first doping type that has a doping concentration that gradually decreases and then increases from the bottom to the top of the pillar in the vertical direction of the semiconductor device 100 from the substrate 110 side. For example, the third pillar 230 may be a p-type pillar. As illustrated in FIGS. 2A through 2K, to form the p-type pillar, a n-type dopant is ion-injected (counter-doped) into the trenches. The first intrinsic silicon layer 140 is deposited into the trenches 130 and then silicon-etched to form the first intrinsic silicon layer 140 having inclined surfaces that inclines into the trenches 130 as illustrated in FIG. 2E. A p-type dopant, such as B or In, is first ion-injected into the first intrinsic silicon layer 140. The second intrinsic silicon layer 145 is deposited on the first intrinsic silicon layer 140, and another dose of a p-type dopant, such as B or In, is then ion-injected into the second intrinsic silicon layer 145. The second dose of dopant may include the same or different dopant material as the first dose of dopant used on the first intrinsic silicon layer 140. As illustrated in FIGS. 3A through 3H, the third pillar 230 may be a p-type pillar that is formed by changing the concentration of p-type dopant, such as B or In, during the process of depositing a plurality of epilayers in stages.

The first, second, and third pillars 210, 220, and 230 as described above are sequentially disposed in the horizontal direction to form the super junction area 200. The super junction area 200 may be divided into first, second, and third areas 201, 202, and 203 from the bottom to the top of the pillars in the vertical direction of the semiconductor device 100 from the substrate 110 side.

The first area 201 of a pillar predominantly includes dopant of a first doping type. For example, a p-type dopant, which is a first doping type, is predominantly concentrated in a lower area of the super junction area 200 due to high p-type doping concentrations in the first and third pillars 210 and 230. Therefore, the charge concentrations in the lower areas of the first and third pillars 210 and 230 are larger than the charge concentration in the lower area of the second pillar 220, for example. In other words, in the first area 201, $Q_p > Q_n$, wherein $Q_p$ denotes a p-type charge quantity, and $Q_n$ denotes an n-type charge quantity.

The second area 202 of the pillars predominantly includes dopant of a second doping type. For example, n-type dopant, which is a second doping type, is predominant concentrated in a middle area of the super junction area 200 due to low p-type doping quantities in the first and third pillars 210 and 230. Therefore, charge quantities of the middle areas of the first and third pillars 210 and 230 are larger than a charge concentration in a middle area of the second pillar 220, for example. In other words, in the second area 202, $Q_p < Q_n$, wherein $Q_p$ denotes a p-type charge quantity, and $Q_n$ denotes an n-type charge quantity.

The third area 203 of the pillars predominantly includes dopant of the first doping type. For example, p-type dopant, which is the first doping type, is predominantly concentrated in an upper area of the super junction area 200 due to high p-type doping concentration in the first and third pillars 210 and 230. Therefore, charge quantities of the upper areas of the first and third pillars 210 and 230 are larger than a charge concentration of an upper area of the second pillar 220. In other words, in the third area 203, for example in the upper area, $Q_p > Q_n$, wherein $Q_p$ denotes a p-type charge quantity, and $Q_n$ denotes an n-type charge quantity.

As described above, the super junction area 200 according to a general aspect may locally change a concentration profile of dopant in a vertical direction in order to prevent a decrease in the distribution of an electric field caused by changes in the doping concentration during the process of fabricating the semiconductor device 100. If one of first and second doping types is predominant, the electric field inclines to one side (e.g., from a lower side to an upper side). However, if dopant of the first or second doping type is locally predominant, an electric field gradually increases in a part of the first pillar 210 in which dopant of the first doping type is predominant, from an upper part of the first pillar 210 to a lower part of the first pillar 210. If an electric field is lowered in an area in which a second doping type is predominant, the electric field distribution may exhibit an M shape. Therefore, the electric field is unlikely to reach a threshold electric field that forms a breakdown voltage, and a high breakdown voltage results.

The body well areas 170 includes p body wells that are formed by injecting dopant of a first doping type into the upper areas of the first and third pillars 210 and 230. For example, the body well areas 170 may includes p-type body wells that are formed by an ion-injection of a p-type dopant such as B or In.

The doping areas 171 are areas that are respectively disposed in a plurality of body well areas and into which dopant of a second doping type is injected. For example, the doping areas 171 may be formed through an ion-injection of an n-type dopant such as P or Ar.

The gate insulating layer 180 is disposed on the doping areas 171 and above the super junction area 200; and the gate electrodes 181 are disposed on the gate insulating layer 180. As a result, when a voltage is applied from an external source, a depletion area may be formed in the super junction area 200.

The insulating layer 182 is formed on the gate electrodes 181 to insulate the gate electrodes 181 from the source electrodes 190.

The source electrodes 190 electrically connect the doping areas 171 to an external device.

As described above, the semiconductor device 100 according to a general aspect forms pillar layers which form an electric field distribution having an M shape in a vertical direction of the substrate 110. Therefore, the dopant concentration in an n-type pillar may be set to be equal to the dopant concentration in a p-type pillar in order to maximize or increase the breakdown voltage.

FIGS. 2A through 2K are cross-sectional views illustrating an example of a method of fabricating a semiconductor device according to a general aspect.

Figure 2A:
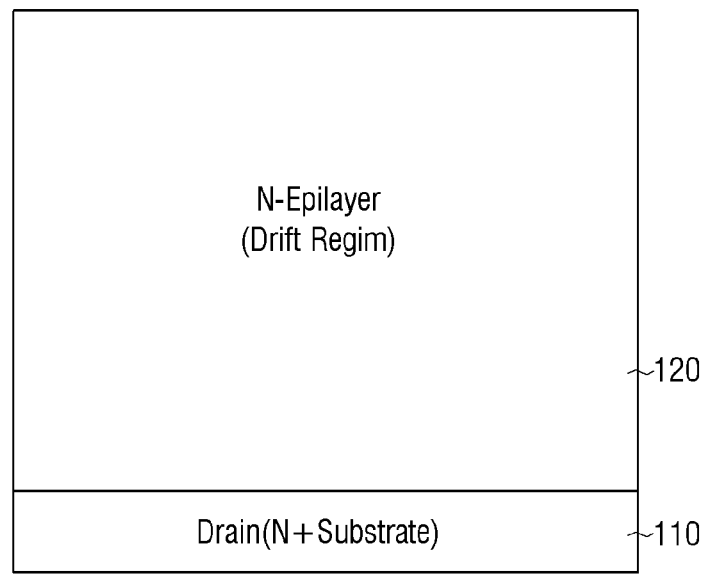
FIGS. 2A through 2K are cross-sectional views illustrating an example of a method of fabricating a semiconductor device.

FIG. 2A illustrates a substrate 110. The substrate 110 may be an n-type substrate into which n-type dopant is doped. An n-type epilayer 120 may be deposited as to have a preset thickness on top of the substrate 110.

Figure 2B:
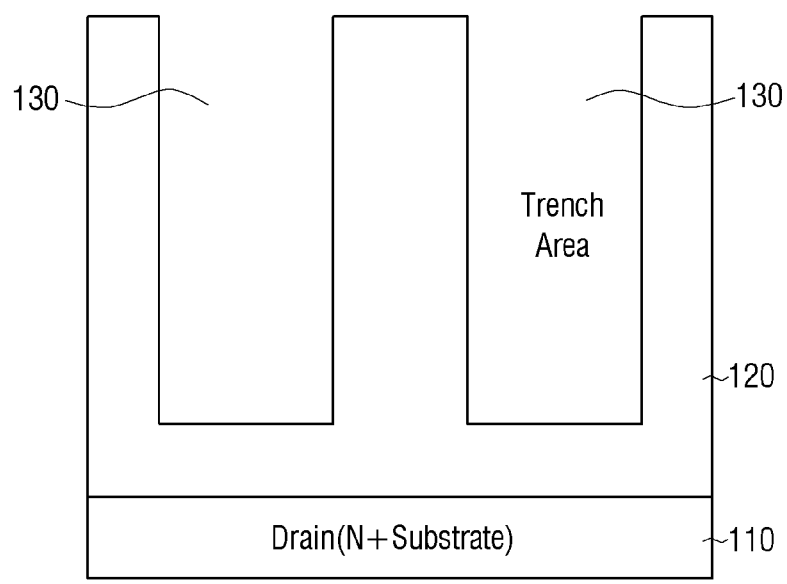

As illustrated in FIG. 2B, a plurality of trenches 130 may be formed in the epilayer 120. For example, two trenches 130 are illustrated in FIG. 2B; however, three or more trenches may be formed when a plurality of super junction areas are to be formed above the substrate. For example, the semiconductor device 100 illustrated in FIG. 1 includes a plurality of super junctions.

Figure 2C:
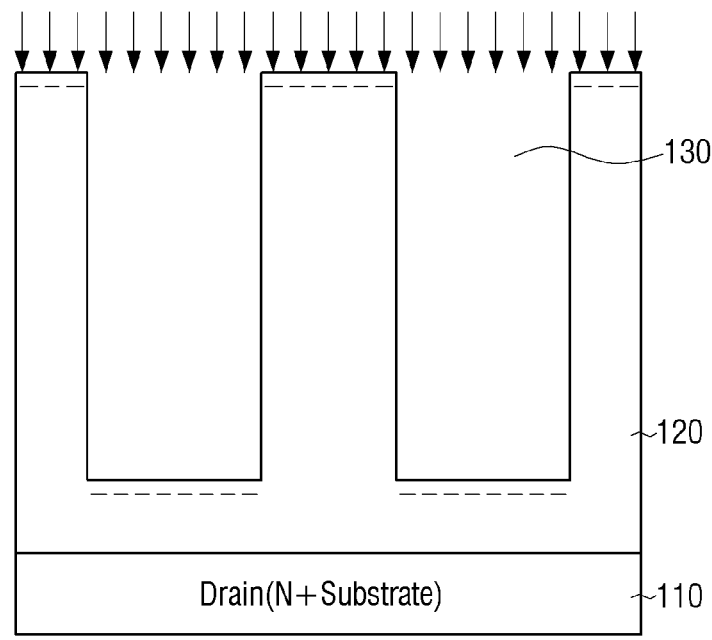

As illustrated in FIG. 2C, an n-type dopant material, such as P or Ar, may be ion-injected into the epilayer 120 via the plurality of trenches 130 by applying an ion-injection process in order to perform a counter-doping into lower parts of the plurality of trenches 130. The counter-doing may prevent dopant of the first doping type from being too predominant in the first area 201 during the subsequent ion-injection process of p-type dopant. The counter-doping process is used in this example; however, the counter-doping process may be omitted in other examples. Besides the plurality of trenches 130, areas into which the n-type dopant has been ion-injected may be removed in a process that is described later with reference to FIG. 2J.

Figure 2D:
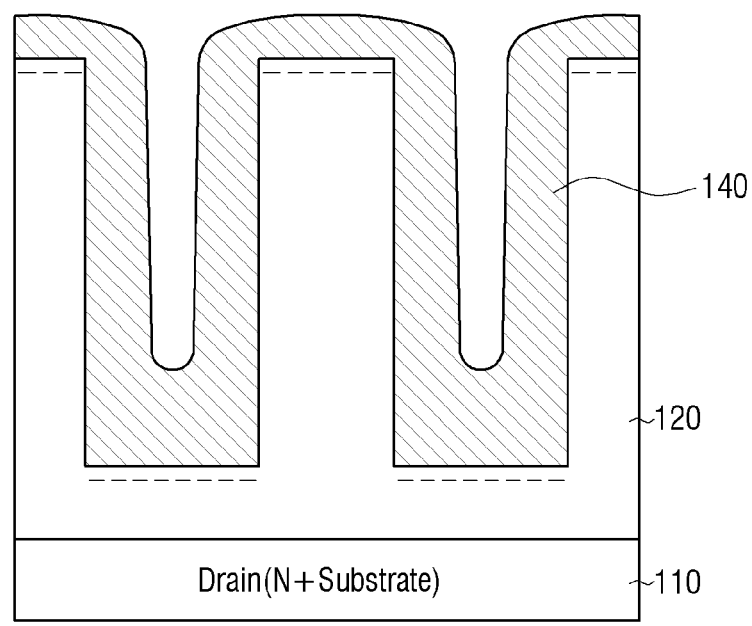
Figure 2E:
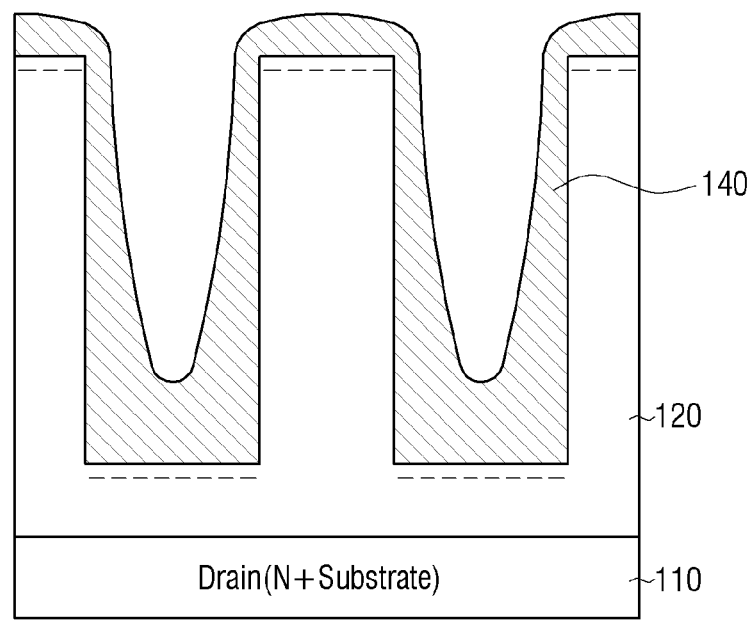

As illustrated in FIG. 2D, a first intrinsic silicon layer 140 is deposited on the trenches 130 and the epilayer 120.

As illustrated in FIG. 2E, silicon etching (or etch back) process may be performed on the first intrinsic silicon layer 140 so that the first intrinsic silicon layer 140 has an inclining shape with inclined surfaces. For example, the silicon etching process may be performed to form the first intrinsic silicon layer 140 in the trenches 130. In this example, a width of the first intrinsic silicon layer 140 narrows from the bottom to the top of the trenches 130 in the vertical direction from the substrate 110. In this example, the silicon etching may be performed to such an extent that the epilayer 120 is exposed in the trenches 130. If the resulting first intrinsic silicon layer 140 has an inclining V shape in its cross-section, the counter doping process as described with reference to FIG. 2C may be omitted.

Figure 2F:
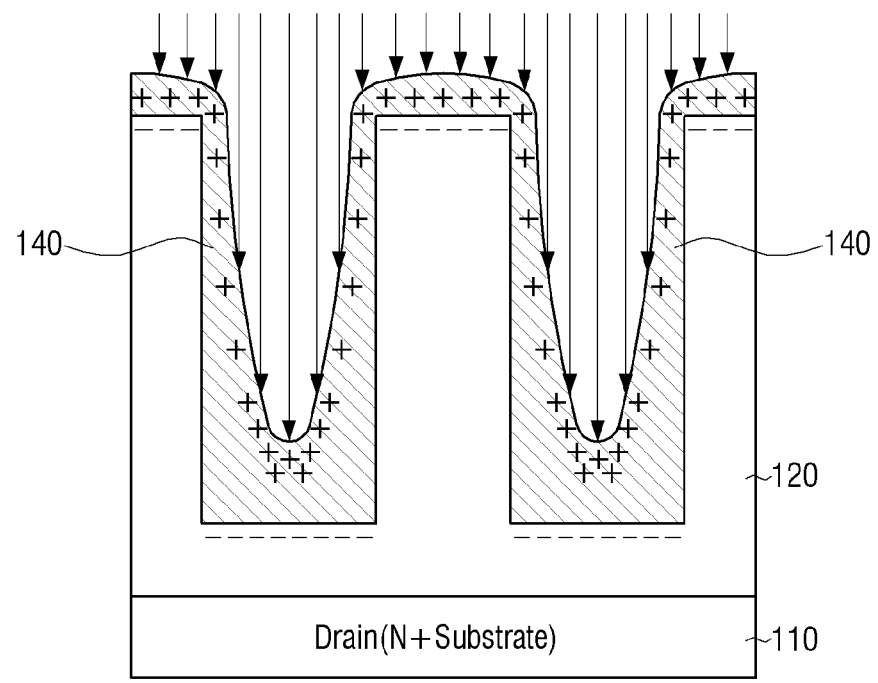

As illustrated in FIG. 2F, to make the dopant of the first doping type to be predominant in the lower area of the super junction area 200, p-type dopant, such as B or In, may be ion-injected into the trenches 130 through an ion-injection process. For example, the ion-injection process may be performed such that dopant quantity (e.i. the dose of dopant that is ion-injected) ranges from $1\times10^{12}/cm^2$ to $9\times10^{13}/cm^2$.

In this example, a dopant quantity of $1\times10^{12}/cm^2$ or more is used for various reasons. For example, if the dopant quantity is less than $1\times10^{12}/cm^2$, the charge quantity of the epilayer 120 (i.e., the quantity of charge in an n-type pillar) of the super junction area 200 corresponding to the dopant quantity is decreased. In this case, the resistance of the n-type pillar increases, and thus the resistance of the semiconductor device also increases. Therefore, an objective of using a super junction structure to lower the resistance of the semiconductor device may not be realized.

On the other hand, a dopant quantity of $9\times10^{13}/cm^2$ or less is used due to the following reasons. If a dopant quantity that exceeds $9\times10^{13}/cm^2$ is used, the charge quantity of the epilayer 120 (i.e., the quantity of charge in the n-type pillar) corresponding to the dopant quantity is increased. In this case, a breakdown voltage is rapidly lowered due to the high quantity of charge in the super junction area 200.

Figure 2G:
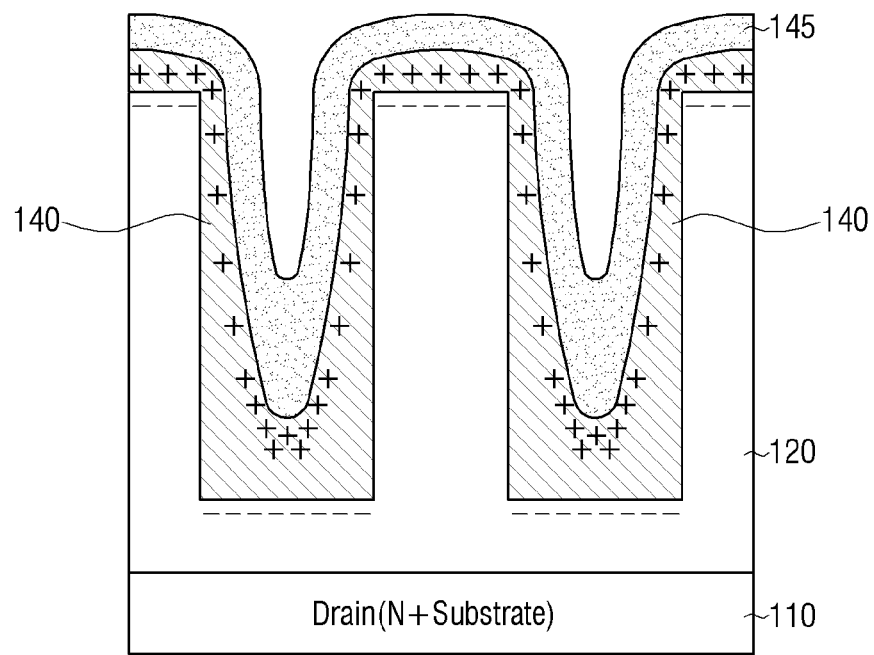

As illustrated in FIG. 2G, a second intrinsic silicon layer 145 is deposited on the first intrinsic silicon layer 140.

Figure 2H:
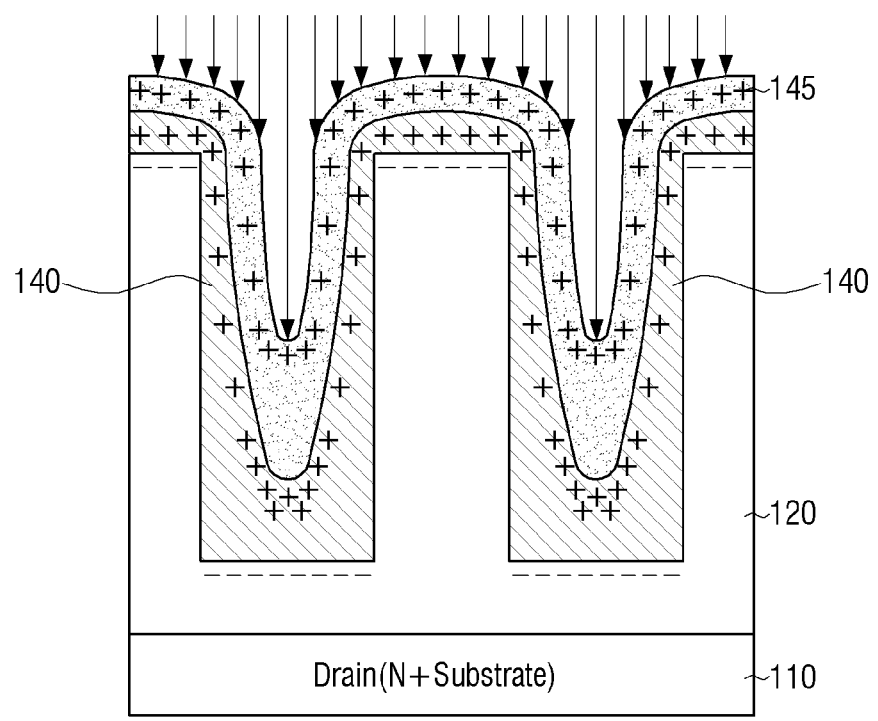

As illustrated in FIG. 2H, a p-type dopant material, such as B or In, may be ion-injected through an ion-injection process. In this example, the ion-injection process may be performed with a dopant quantity lower than or equal to half of the dopant quantity injected into the first intrinsic silicon layer 140. An ion-injection process may be performed under the above-described dopant condition to realize a p-type pillar having a doping concentration which gradually decreases and then increases from the bottom to the top of the pillar in a vertical direction of trenches.

Figure 2I:
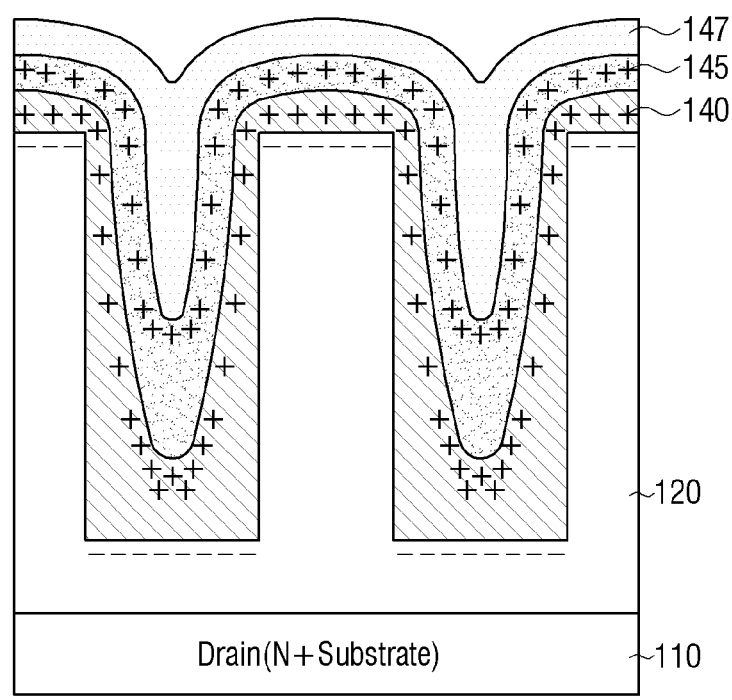

As illustrated in FIG. 2I, a third intrinsic silicon layer 147 is deposited on the second intrinsic silicon layer 145 to fill the gaps between the trenches 130.

Figure 2J:
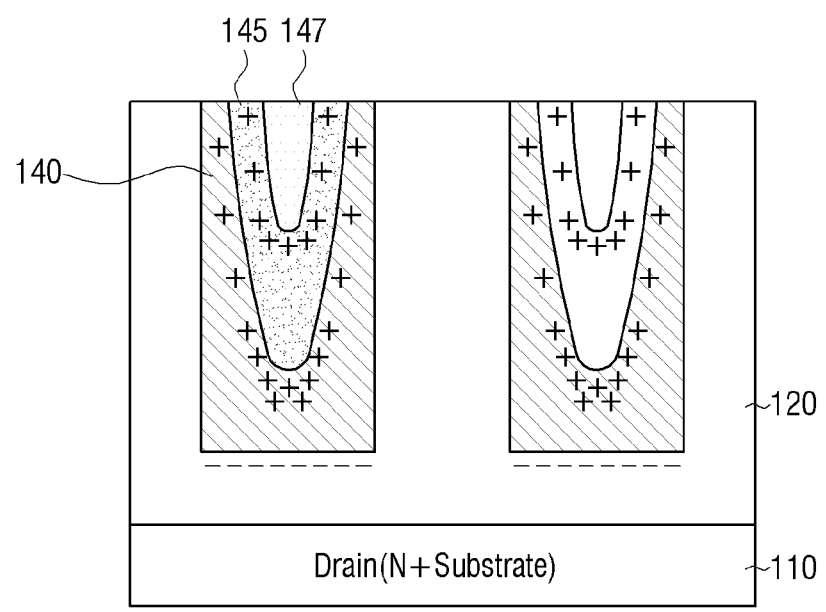

As illustrated in FIG. 2J, an upper area of the epilayer 120 may be polished to remove the portion of the upper area in which n-type dopant is present. For example, the upper area of the epilayer 120 may be polished through a chemical mechanical polishing (CMP) method in order to remove an area of the epilayer 120 into which the n-type dopant has been injected that are outside of the plurality of trenches 130 and the portions of the first, second, and third intrinsic silicon layers 140, 145, and 147 formed in the plurality of trenches 130.

Due to the above-described process, as illustrated in FIG. 2J, the first and third pillars 210 and 230 may have doping concentrations that gradually decrease and then increase from the bottom to the top of the pillars in the vertical direction from the substrate 110. The horizontal area outside the first and third pillars 210 and 230 forms the second pillar 220.

Figure 2K:
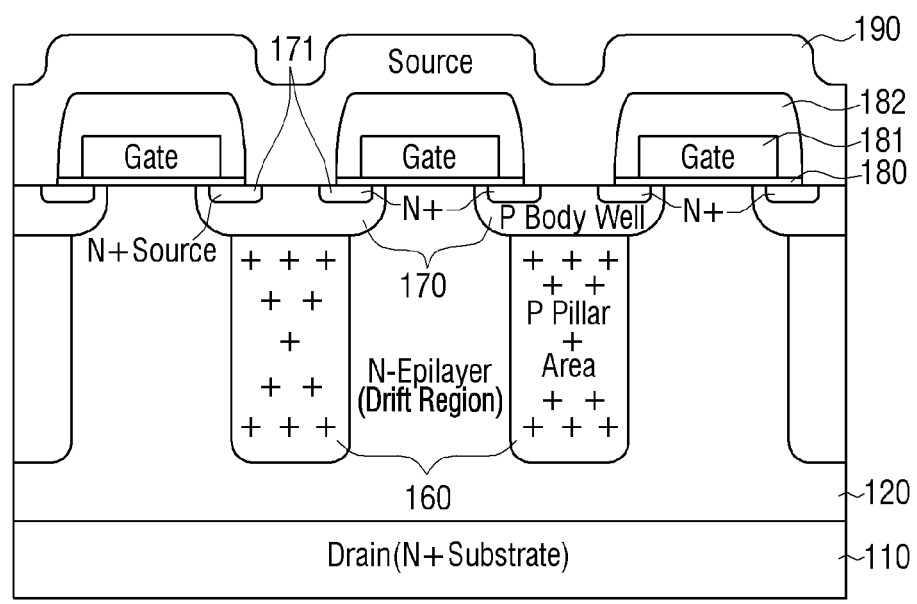

To obtain a MOSFET that is illustrated in FIG. 2K, the processes of forming the body well areas 170, the doping areas 171 in the body well areas 170, the gate insulating layer 180, the gate electrodes 181, the insulating layer 182, the source electrodes 190, and the like, may be performed to the semiconductor device in sequence.

FIGS. 3A through 3H are cross-sectional views illustrating another example of a method of fabricating a semiconductor device.

Figure 3A:
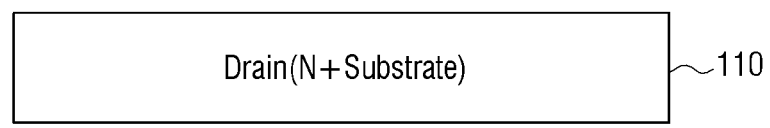
FIGS. 3A through 3H are cross-sectional views illustrating another example of a method of fabricating a semiconductor device.

FIG. 3A illustrates a substrate 110. The substrate 110 may be an n-type substrate into which n-type dopant has been doped.

Figure 3B:
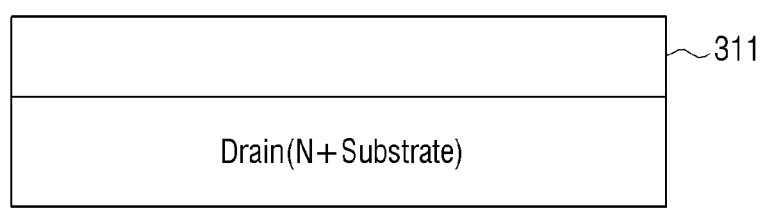

As illustrated in FIG. 3B, a first n-type epilayer 311 is deposited as to have a preset thickness on top of the substrate 110.

Figure 3C:
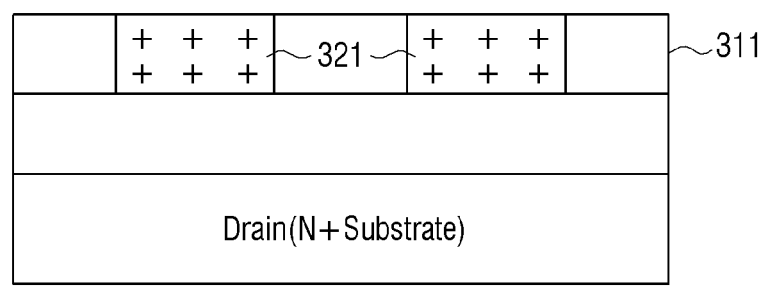

As illustrated in FIG. 3C, an ion-injection process of dopant of a first doping type may be performed into a first position on the first epilayer 311. For example, a p-type dopant material, such as B or In, may be ion-injected into the first position on the first epilayer 311 so that a quantity of p-type dopant that is greater than the quantity of n-type dopant in the n-type pillar area of the first epilayer 311 remains in the first position. In this example, ions are not injected into the n-type pillar area of the first epilayer 311; thus, the n-type pillar is formed in the n-type pillar area of the first epilyaer 311 in order to obtain a predominance of a first doping type dopant in a lower area of a super junction area 200.

Figure 3D:
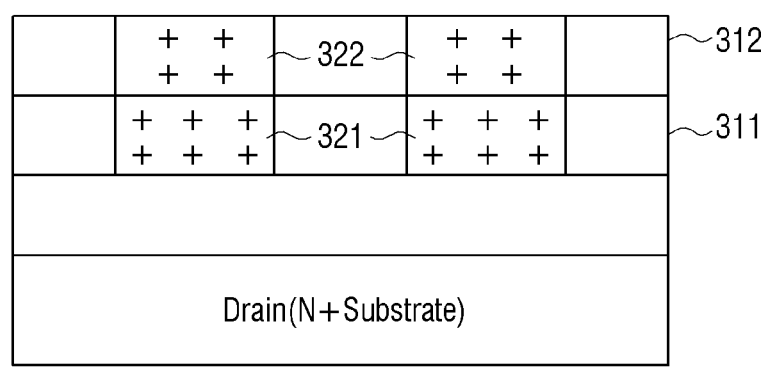

As illustrated in FIG. 3D, a second epilayer 312 of n-type is deposited on the first epilayer 311, and an ion-injection process of a first doping type dopant may be performed with respect to a second position on the second epilayer 312. For example, a p-type dopant material, such as B or In, may be ion-injected into the second position (the same area as the first position on a vertical line) on the second epilayer 312 so that a quantity of p-type dopant that is greater than the quantity of n-type dopant in an n-type pillar area of the second epilayer 312 remains in the second position. In this example, ions are not injected into the n-type pillar area of the second epilayer 312; thus, the n-type pillar may be formed in the n-type pillar area to obtain the predominance of dopant of the first doping type and the curves of doping concentrations in the pillars in the lower area of the super junction area 200.

Figure 3E:
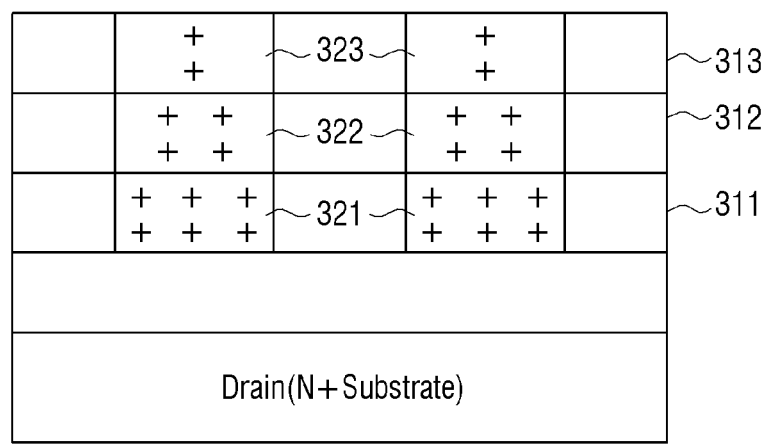

As illustrated in FIG. 3E, a third epilayer 313 of n-type is deposited on the second epilayer 312, and an ion-injection process of a first doping type dopant may be performed with respect to a third position on the third epilayer 313. For example, a p-type dopant material, such as B or In, may be ion-injected into the third position (the same area as the second position on the vertical line) on the third epilayer 313 so that a larger quantity of p-type dopant than a quantity of n-type dopant of an n-type pillar area of the third epilayer 313 remains in the third area. In this example, ions are not injected into the n-type pillar area of the third epilayer 313; thus, the n-type pillar is formed in the n-type pillar area to obtain a predominance of a second doping type in a middle area of the super junction area 200.

Due to the above-described processes illustrated in FIG. 3C to 3E, the lower epilayers (311, 312, and 313) may be formed on a substrate to have doping concentrations which gradually decrease from the bottom to the top of the epilayers in a vertical direction from the substrate 110.

Figure 3F:
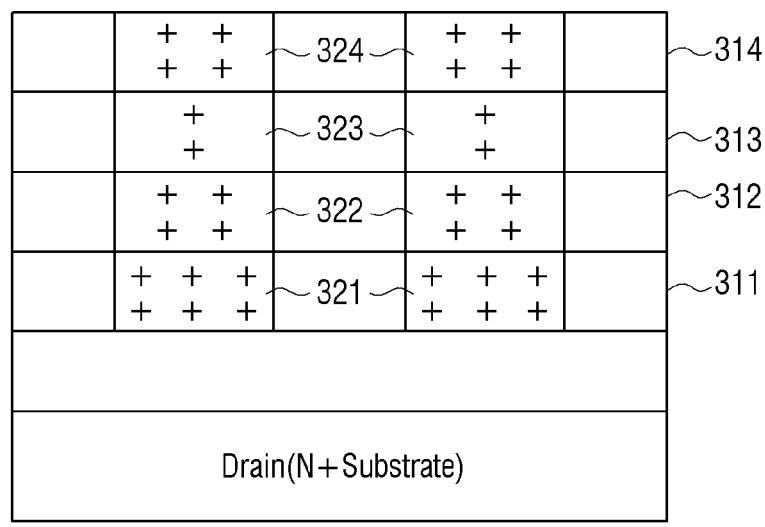

As illustrated in FIG. 3F, a fourth epilayer 314 of n-type is deposited on the third epilayer 313, and an ion-injection process of a first doping type dopant may be performed with respect to a fourth position on the fourth epilayer 314. For example, a p-type dopant material, such as B or In, is ion-injected into the fourth position (the same area as the third position on the vertical line) on the fourth epilayer 314 so that a quantity of p-type dopant that is greater than the quantity of n-type dopant in an n-type pillar area of the fourth epilayer 314 remains in the fourth position. In this example, ions are not injected into the n-type pillar area of the fourth epilayer 314; thus, the n-type pillar may be formed in the n-type pillar area to obtain the predominance of dopant of the first doping type and the curves of doping concentrations in pillars in an upper area of the super junction area 200.

Figure 3G:
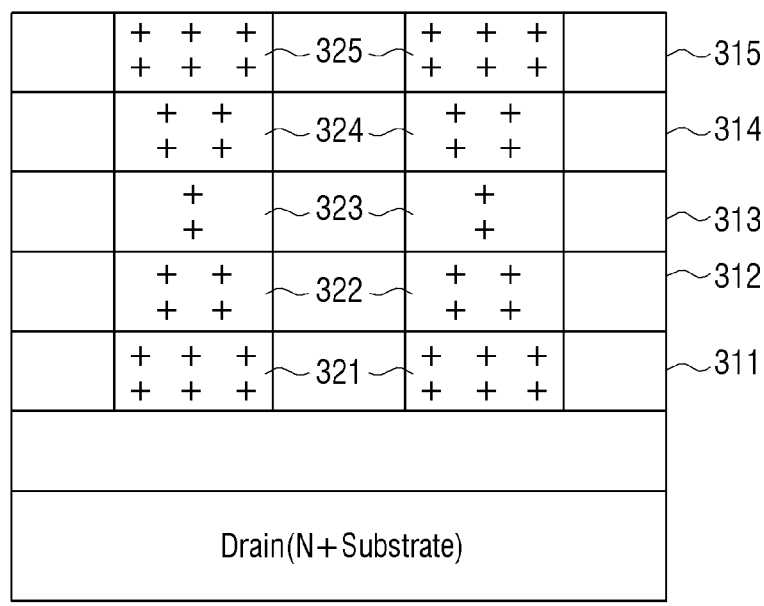

As illustrated in FIG. 3G, a fifth epilayer 315 of n-type is deposited on the fourth epilayer 314, and an ion-injection process may be performed on a fifth position of the fifth epilayer 315 with dopant of the first doping type. For example, to obtain the predominance of dopant of the first doping type and the curves of doping concentrations in pillars in the upper area of the super junction area 200, a quantity of p-type dopant that is greater than the quantity of dopant in the fifth epilayer 315 of the n-type may be ion-injected into the fifth position (the same area as the fifth position on the vertical line) on the fifth epilayer 315.

Due to the processes illustrated in FIGS. 3F and 3G, the upper eiplayers (314 and 315) may be formed on lower epilayers (311, 312, and 313) to have doping concentrations which gradually increase from the bottom to the top in the vertical direction of the substrate.

Figure 3H:
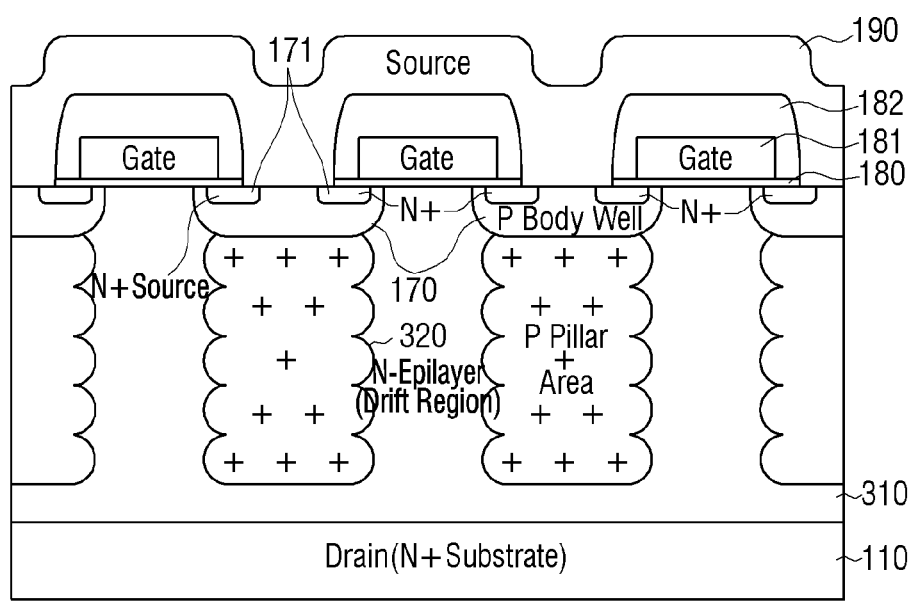

Due to the above-described processes, as illustrated in FIG. 3H, the first and third pillars 210 and 230 may be formed to have doping concentrations that gradually decrease and then increase from the bottom to the top of the pillars in the vertical direction from the substrate 110. A horizontal area outside the first and third pillars 210 and 230, for example, the remaining n-type epilayer between the first and third pillars 210 and 230, may form the second pillar 220.

Further, to form a MOSFET, the processes of forming body well areas 170, doping areas 171 in the body well areas 170, an gate insulating layer 180, gate electrodes 181, an insulating layer 182, source electrodes 190, and the like, may be performed in sequence to obtain the structure of the semiconductor device illustrated in FIG. 3H.

As illustrated in FIGS. 3A through 3H, the epilayer are deposited in five separate steps, and the ion-injection processes are performed five times to form the super junction area 200. However, in other examples, a three-layered epilayer or a four-layered epilayer may be formed, or a six-layered epilayer or an epilayer with even more layers may be formed to obtain the super junction area 200.

Figure 4:
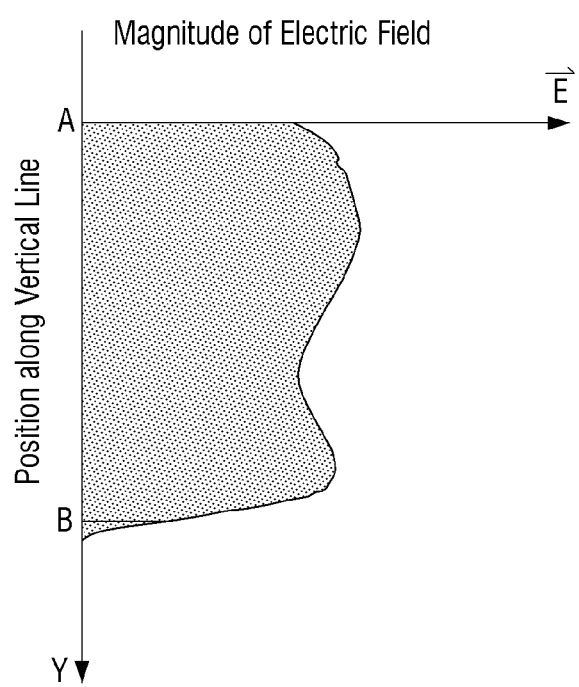
FIG. 4 is a graph illustrating an electric field distribution in a semiconductor device.
Figure 5:
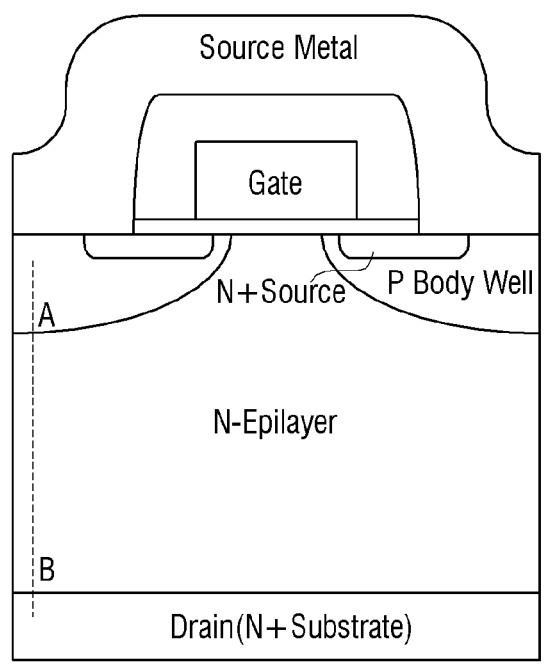
FIG. 5 is a cross-sectional view illustrating an example of a structure of a conventional planar gate metal oxide semiconductor field effect transistor (MOSFET).
Figure 6:
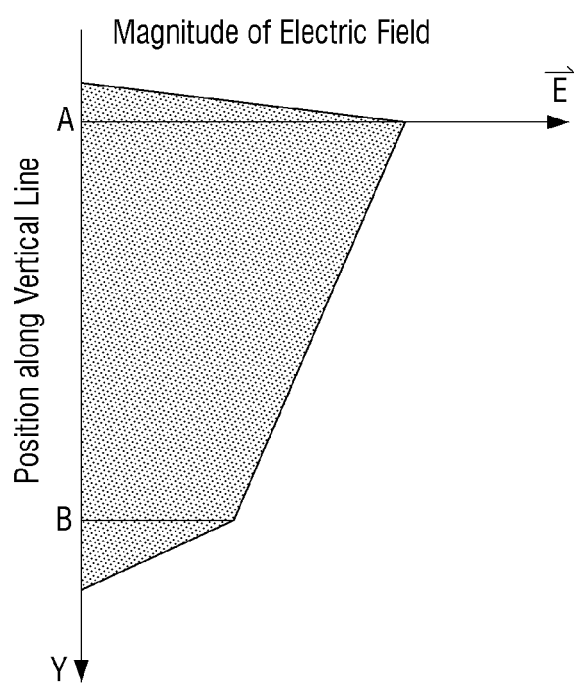
FIG. 6 is a graph illustrating an electric field distribution that is formed between area A and area B in the MOSFET illustrated in FIG. 5.
Figure 7:
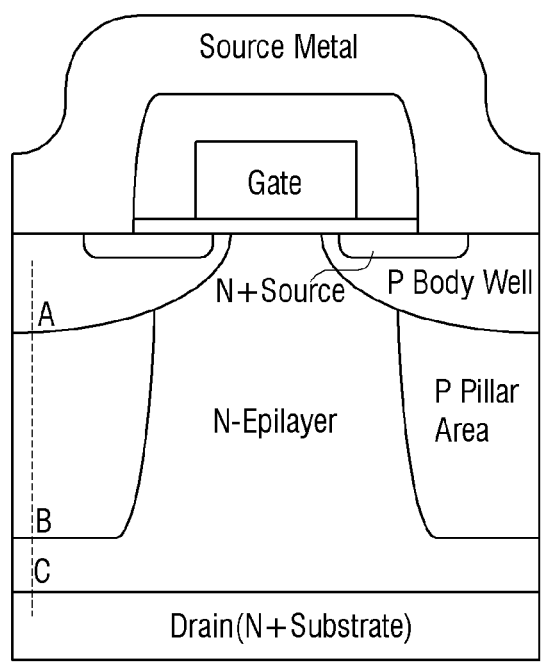
FIG. 7 is a cross-sectional view illustrating an example of a structure of a semiconductor device having a super junction structure.
Figure 8:
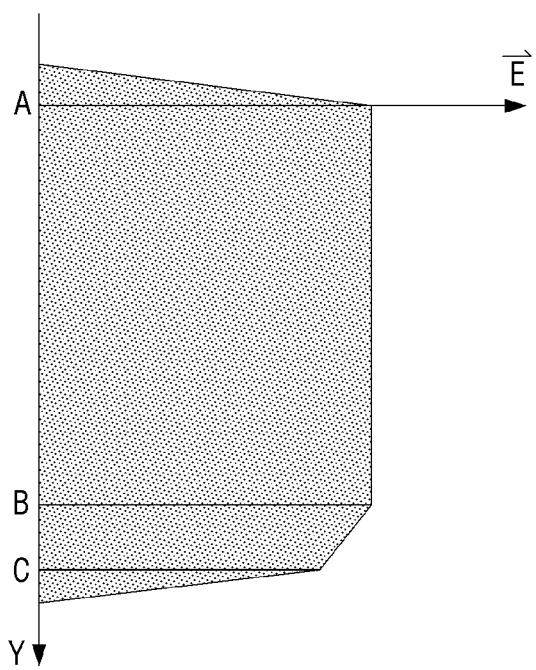
FIG. 8 is a graph illustrating an electric field distribution that is formed between areas A, B and area C in the semiconductor device illustrated in FIG. 7.
Figure 9:
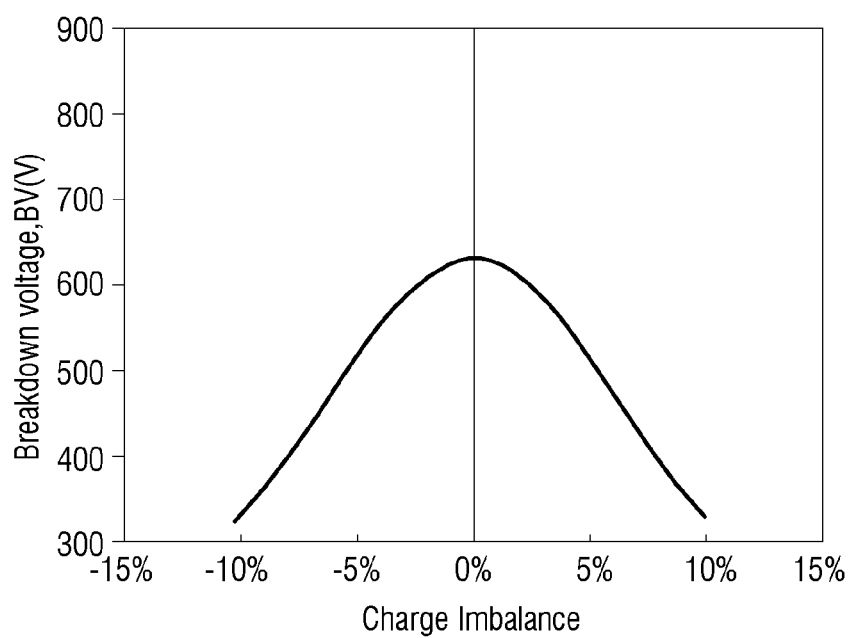
FIG. 9 is a graph illustrating changes in a breakdown voltage with respect to changes in a charge imbalance.

FIG. 4 is a graph illustrating an electric field distribution of one example semiconductor device according to a general aspect. In the graph, position A denotes a location in an upper area 203 of the super junction area 200 illustrated in FIG. 1, and position B denotes a location in a lower area 201 of the super junction area 200 illustrated in FIG. 1. The x-axis indicates the electric field distribution in the semiconductor device at the various vertical positions of the semiconductor device.

In the graph illustrated in FIG. 4, the electric field distribution of a p-type pillar of the semiconductor device according to the above described example has an M shape. As illustrated by the electric field distribution, a concentration profile of dopant of the p-type pillar locally changes in a vertical direction of the substrate. Therefore, an internal voltage may be prevented from being lowered due to an imbalance between the n-type and p-type dopants during the fabricating process.

In the above-described examples, the term "predominant" indicates more than 50%. For example, if dopant of a first doping type is predominant in an area, the dopant of the first doping type is present in a higher concentration than the dopant of the second doping type in that area.

As described above, according to the above-described examples, in a semiconductor device and a fabricating method thereof, charge quantities of upper and lower parts of a p-type pillar may be larger than charge quantities of upper and lower parts of an n-type pillar. A charge quantity of a middle part of the p-type pillar may be smaller than a charge quantity of a middle part of the n-type pillar. Therefore, the electric field distribution of the semiconductor device may have an M shape, and the electric field may have an increasing area and a decreasing area in the vertical direction of the semiconductor device according to a depth thereof. As a result, if a charge quantity of either the n-type or p-type pillars is different from a charge quantity of either p-type or n-type pillar due to the distribution process, the electric field may change in opposite directions in the increasing and decreasing areas, thereby relieving the degree of reduction of the breakdown voltage.

As a result, the margin for a mass production process may be increased. Also, an area of an electric field graph may be wider than a structure having effects as described above and a semicircular electric field. Therefore, a semiconductor device may have a high maximum breakdown voltage.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor device having a super junction structure, the semiconductor device comprising:
    a substrate; and
    a super junction area which is disposed above the substrate and comprises first doping type pillars and second doping type pillars, which are alternately disposed,
    wherein one of the first doping type pillars of the super junction area has a doping concentration which gradually decreases from a bottom of the pillar to an area of lowest concentration and then gradually increases to a top of the pillar in a vertical direction of the substrate;
    one of the second doping type pillars has a substantially constant doping concentration from a top of the pillar to a bottom of the pillar in the vertical direction; and
    a magnitude of electric field in the semiconductor device gradually decreases from an area of maximum magnitude in an upper area of the one of the first doping type pillars to an area of lowest magnitude and gradually increases from the area of lowest magnitude to an area of maximum magnitude in a lower area of the pillar in the vertical direction, such that a distance from the area of maximum magnitude in the upper area to the area of lowest magnitude is greater than a distance from the area of lowest magnitude to the area of maximum magnitude in the lower area of the pillar.

2. The semiconductor device as claimed in claim 1, wherein the super junction area comprises first, second, and third areas which are sequentially disposed from the bottom to the top in the vertical direction of the substrate,
    wherein a first doping type is predominant in the first and third areas, and a second doping type is predominant in the second area.

3. The semiconductor device as claimed in claim 2, wherein the first doping type is a P-type, and the second doping type is an N-type.

4. The semiconductor device as claimed in claim 1, wherein the first doping type pillars include a first pillar and a third pillar; the second doping type pillars include a second pillar; and the first pillar, the second pillar and a third pillar are sequentially disposed in a horizontal direction of the substrate.

5. The semiconductor device as claimed in claim 4, wherein the first and third pillars have doping concentrations which gradually decrease and then increase from the bottom to the top of each pillar in the vertical direction of the substrate.

6. The semiconductor device as claimed in claim 5, wherein:
charge quantities of lower areas of the first and third pillars are larger than a charge quantity of a lower area of the second pillar;
charge quantities of middle areas of the first and third pillars are smaller than a charge quantity of a middle area of the second pillar; and
charge quantities of upper areas of the first and third pillars are larger than a charge quantity of an upper area of the second pillar.

7. The semiconductor device as claimed in claim 5, wherein the first doping type is a P-type, and the second doping type is an N-type.

8. The semiconductor device as claimed in claim 5, further comprising:
a plurality of well areas of a first doping type which are respectively disposed on the first and third pillars;
a plurality of doping areas of a second doping type which are disposed in the plurality of well areas;
an insulating layer which is disposed over the plurality of doping area and on the super junction area;
gate electrodes which are formed on the insulating layer; and
source electrodes which are formed on the plurality of well areas.

9. The semiconductor device as claimed in claim 1, wherein the substrate is an N-type substrate.

10. A method of fabricating a semiconductor device, the method comprising:
forming a super junction area above a substrate, wherein pillars of different doping types are alternately disposed in the super junction area;
forming a plurality of well areas of a first doping type respectively on a plurality of pillars of the super junction area having the same doping type;
forming a plurality of doping areas of a second doping type in the plurality of well areas;
a forming an insulating layer which is disposed over the plurality of doping areas and on the super junction area;
forming gate electrodes on the insulating layer; and
forming source electrodes on the plurality of well areas,
wherein one of the pillars of the super junction area has a doping concentration which gradually decreases from a bottom of the pillar to an area of lowest concentration and then gradually increases to a top of the pillar in a vertical direction of the substrate, and another one of the pillars of the super junction area has a substantially constant doping concentration from a top of the pillar to a bottom of the pillar in the vertical direction;
the super junction area is formed to comprise a first area in which a first doping type is predominant, a second area in which a second doping type is predominant, and a third area in which a first doping type is predominant;
the first, second, and third areas are sequentially disposed from the bottom in the vertical direction of the substrate; and
a magnitude of electric field in the semiconductor device gradually decreases from an area of maximum magnitude in an upper area of the one of the pillars to an area of lowest magnitude and gradually increases from the area of lowest magnitude to an area of maximum magnitude in a lower area of the pillar in the vertical direction, such that a distance from the area of maximum magnitude in the upper area to the area of lowest magnitude is greater than a distance from the area of lowest magnitude to the area of maximum magnitude in the lower area of the pillar.

11. The method as claimed in claim 10, wherein the first doping type is a P-type, and the second doping type is an N-type.

12. The method as claimed in claim 10, wherein the super junction area is formed to comprise a first pillar of a first doping type, a second pillar of a second doping type, and a third pillar of the first doping type which are sequentially disposed in a horizontal direction of the substrate.

13. The method as claimed in claim 12, wherein the first and third pillars have doping concentrations which gradually decrease and then increase from the bottom to the top of each pillar in the vertical direction of the substrate.

14. The method as claimed in claim 12, wherein:
charge quantities of lower areas of the first and third pillars are larger than a charge quantity of a lower area of the second pillar;
charge quantities of middle areas of the first and third pillars are smaller than a charge quantity of a middle area of the second pillar; and
charge quantities of upper areas of the first and third pillars are larger than a charge quantity of an upper area of the second pillar.

15. The method as claimed in claim 12, wherein the first doping type is a P-type, and the second doping type is an N-type.

16. The method as claimed in claim 10, wherein the formation of the super junction area comprises:
depositing an epilayer of a second doping type on the substrate;
forming a plurality of trenches in the epilayer;
depositing a first intrinsic silicon layer in the plurality of trenches so that the first intrinsic silicon layer is inclined;
performing an ion-injection process of a first doping type with respect to the first intrinsic silicon layer;
depositing a second intrinsic silicon layer on the first intrinsic silicon layer; and
performing an ion-injection process of a first doping type with respect to the second intrinsic silicon layer.

17. The method as claimed in claim 16, wherein the formation of the super junction area further comprises:
depositing a third intrinsic silicon layer on the second intrinsic layer to fill gaps between the plurality of trenches; and
polishing an upper part of the substrate.

18. The method as claimed in claim 16, wherein the first intrinsic silicon layer has a width which narrows from the bottom to the top in the vertical direction of the substrate.

19. The method as claimed in claim 16, wherein the first intrinsic silicon layer has a V shape.

20. The method as claimed in claim 16, wherein the formation of the super junction area further comprises: before depositing the first intrinsic silicon layer, performing an ion-injection process of a second doping type.

21. The method as claimed in claim 10, wherein the formation of the super junction area comprises:
forming a lower epilayer on the substrate, wherein the lower epilayer has a doping concentration which gradually decreases from the bottom to the top in the vertical direction of the substrate; and forming an upper epilayer on the lower epilayer, wherein the upper epilayer has a doping concentration which gradually increases from the bottom to the top in the vertical direction of the substrate.

22. The method as claimed in claim 21, wherein a process of depositing an epilayer and an ion-injection process are repeatedly performed to form the lower epilayer having the doping concentration which gradually decreases from the bottom to the top in the vertical direction of the substrate.

23. The method as claimed in claim 21, wherein a process of depositing an epilayer and an ion-injection process are repeatedly performed to form the upper epilayer on the lower epilayer, wherein the upper epilayer has a doping concentration which gradually increases from the bottom to the top in the vertical direction of the substrate.

24. The method as claimed in claim 10, wherein the formation of the super junction area further comprises:

depositing a first epilayer of a second doping type on the substrate;

performing a first ion-injection process of a first doping type with respect to a first position on the first epilayer;

depositing a second epilayer of a second doping type on the first epilayer;

performing a second ion-injection process of a first doping type with respect to a second position on the second epilayer in a smaller dopant quantity than in the first ion-injection process;

depositing a third epilayer of a second doping type on the second epilayer;

performing a third ion-injection process of a first doping type with respect to a third position on the third epilayer in a smaller dopant quantity than in the second ion-injection process;

depositing a fourth epilayer of a second doping type on the third epilayer;

performing a fourth ion-injection process of a first doping type with respect to a fourth position on the fourth epilayer in a smaller dopant quantity than in the third ion-injection process;

depositing a fifth epilayer of a second doping type on the fourth epilayer; and performing a fifth ion-injection process of a first doping type with respect to a fifth position on the fifth epilayer in a larger dopant quantity than the fourth ion-injection process, wherein the first, second, third, fourth, and fifth positions are the same positions in a horizontal direction of the semiconductor device.

* * * * *